(12) United States Patent
Lee

(10) Patent No.: US 8,170,843 B2
(45) Date of Patent: May 1, 2012

(54) GENERIC HARD/SOFT 3D SPATIAL COLLISION DETECTION METHOD

(75) Inventor: David J. Lee, Mukilteo, WA (US)

(73) Assignee: The Boeing Company, Chicago, IL (US)

( * ) Notice: Subject to any disclaimer, the term of this patent is extended or adjusted under 35 U.S.C. 154(b) by 970 days.

(21) Appl. No.: 11/802,828

(22) Filed: May 25, 2007

(65) Prior Publication Data

US 2007/0233434 A1 Oct. 4, 2007

Related U.S. Application Data

(63) Continuation-in-part of application No. 10/802,921, filed on Mar. 18, 2004, now Pat. No. 7,529,649.

(51) Int. Cl.
*G06F 7/60* (2006.01)
*G06F 17/10* (2006.01)

(52) U.S. Cl. ............... 703/2; 345/958; 345/959

(58) Field of Classification Search .............. 703/2, 6; 345/958, 959
See application file for complete search history.

(56) References Cited

U.S. PATENT DOCUMENTS

| 5,611,503 | A | 3/1997 | Brauer |
| 6,004,016 | A * | 12/1999 | Spector ............ 700/56 |
| 6,067,096 | A * | 5/2000 | Nagle ............ 345/473 |
| 6,113,644 | A | 9/2000 | Weber et al. |
| 6,611,503 | B1 | 8/2003 | Fitzgerald et al. |
| 6,947,875 | B2 | 9/2005 | Winkler et al. |
| 2002/0026296 | A1 | 2/2002 | Lohmann et al. |
| 2002/0161563 | A1 | 10/2002 | Elabiad et al. |
| 2004/0010398 | A1 | 1/2004 | Noma et al. |
| 2005/0209830 | A1 | 9/2005 | Lee et al. |
| 2007/0239409 | A1 * | 10/2007 | Alan ............ 703/2 |

OTHER PUBLICATIONS

Wikipedia, "Invisible wall", dated Oct. 2005 (printed Oct. 6, 2010), http://en.wikipedia.org/w/index.php?title=Invisible_wall&oldid=26936205.*

* cited by examiner

*Primary Examiner* — David Silver

(57) ABSTRACT

A method for resolving collisions for placement of objects in 3D models, including attributing a first state to each object having a hard spatial volume and a second state to each object having a soft spatial volume, predefining a first set of rules to determine whether multiple objects may occupy the same spatial volume based on the combination of the object states, the first set of rules covering all permutations of said first state and said second state, placing a first object in the 3D model, placing a second object in the 3D model, determining whether the first object has a collision with the second object in the 3D model, and resolving the collision based on said first predefined set of rules. Furthermore, there can be predefining a second set of rules that override the first set of rules, and where the resolving of the collision is based on said second set of rules. Further, the method includes finding "soft" and "hard" characters on all objects and defining the characters on all objects.

26 Claims, 17 Drawing Sheets

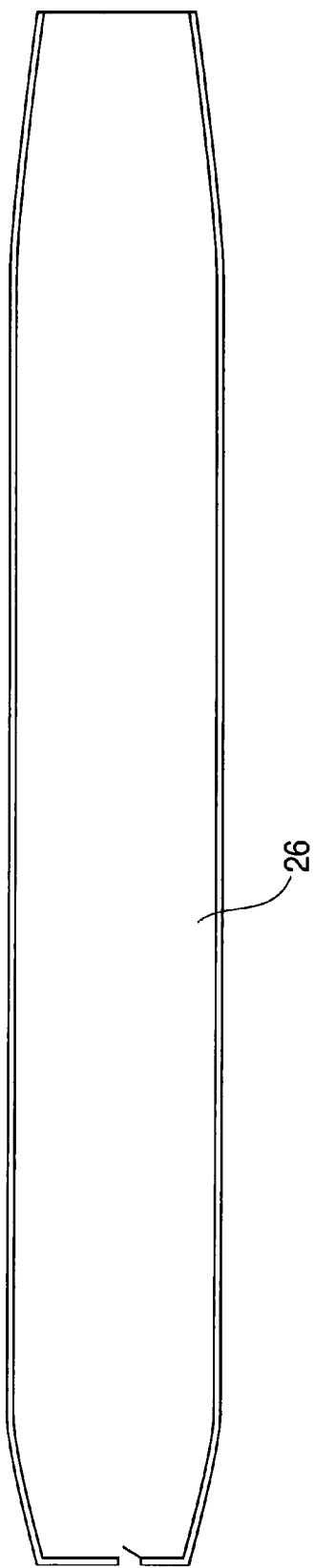

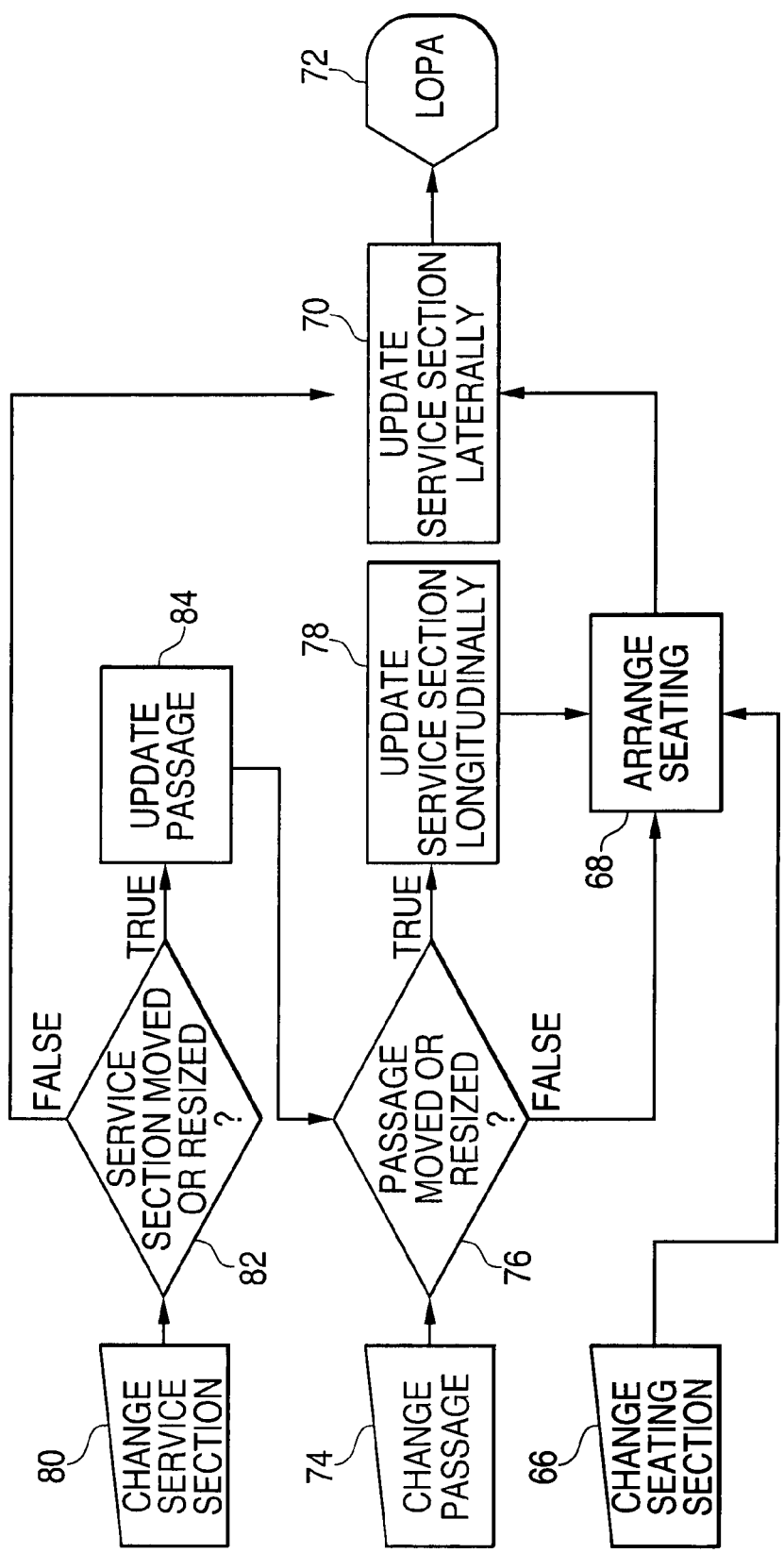

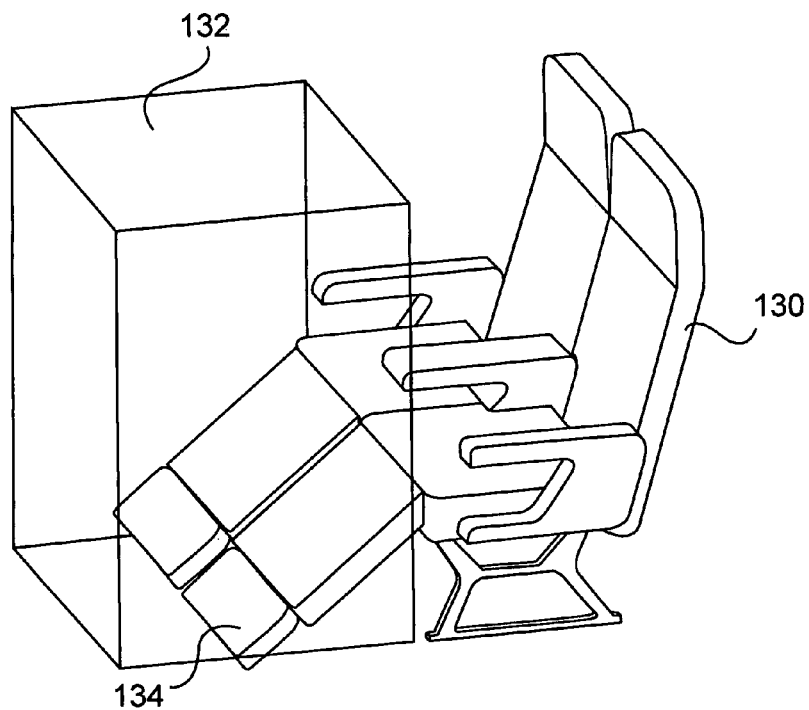
FIG. 7
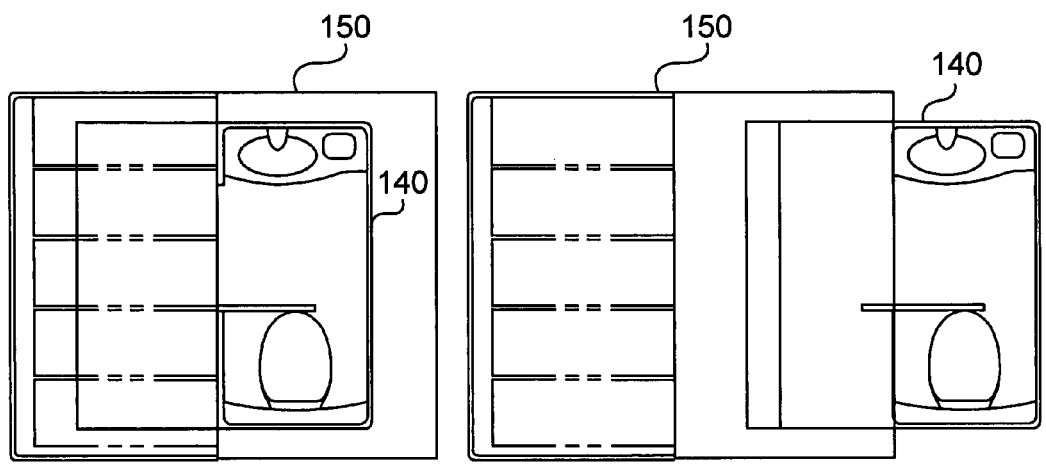
FIG. 8  FIG. 9

GENERIC HARD/SOFT 3D SPATIAL COLLISION DETECTION METHOD

CROSS-REFERENCE TO RELATED APPLICATIONS

This application claims priority to and is a continuation-in-part of U.S. patent application entitled, SYSTEM AND METHOD FOR KNOWLEDGE BASED INTERIOR DEVELOPMENT, filed Mar. 18, 2004, having a Ser. No. 10/802,921, now U.S. Pat. No. 7,529,649, the disclosure of which is hereby incorporated herein in its entirety by reference. This application cross-references pending U.S. patent application Ser. No. 11/802,827 entitled TRANSFORMING AIRPLANE CONFIGURATION REQUIREMENTS INTO INTELLIGENT SPATIAL GEOMETRY, filed on the same date as this application and incorporated herein in its entirety by reference.

FIELD OF THE INVENTION

The present invention relates generally to configuration of configurable spaces. More particularly, the present invention relates to the configuration of configurable spaces with regard to collision resolution, where the objects are digitally represented as well as three dimensional stay-out spaces.

BACKGROUND OF THE INVENTION

Interior design for configurable spaces, including passenger vehicles, such as airplanes, buses, subway and train cars, requires adherence to numerous standards and rules. For example, in the United States, the Federal Aviation Administration imposes restrictions on commercial airliners regarding the number of doors, distance between doors and seats or other landmarks, and width of aisles. Additionally, customers or users of the passenger vehicles submit their own requirements regarding distance between seats and other landmarks, in different classes of seating. In addition to specific rules, an overriding concern of manufacturers and purchasers of passenger vehicles is often the optimization of the available interior space to fit the most possible passengers, given the constraints of government, industry, and/or customer rules.

Current interior configuration modeling systems use a manually intensive process. Systems are able to model an interior using exact coordinates of each landmark, without regard for the location of each landmark relative to the other landmarks. This manually intensive process has trouble keeping pace with the rapid change in overall aircraft configuration. For example, if a person charged with the configuration of interiors of passenger vehicles (an "interior configurator") adds a landmark to the configuration, current interior configuration models are unable to shift seats or other landmarks in an efficient way, while also taking into account the constraints of rules imposed by governments, industry standards, and/or customers. Thus, the configurator would have to manually adjust the configuration of the interior to meet rules and standards.

Also, current interior configuration models do not automatically insure optimal seat and landmark locations, allowing for the largest number of seats possible under current constraints. Decisions made using current configuration models are based on limited arrangement data requiring an educated guess as to whether a configuration is optimized. Because the current tools require manual entry of coordinate data for landmarks and seats, the current tool requires constant regular use and a high level of expertise in order to be proficient at configuring and designing interiors. Finally, current tools allow for only manual extraction of internal configuration data, which is of limited utility for downstream processes such as assembly or maintenance.

Accordingly, it would be desirable to use a knowledge-based approach to automate the interior development process. Also, it would be desirable to store configuration data in a manner so that it is accessible to downstream users.

When an airplane is designed for an airline, one of the decisions the airline customer needs to make is what commodities, accessories, spatial walking room, etc. is required for their unique airplane in the passenger compartment where passengers board and travel. This passenger compartment in design terms is called a LOPA, Layout Passenger Accommodations, because it accommodates all the passenger requirements as they sit and travel in the airplane.

Included in the LOPA are physical commodities, such as Galleys, Lavatories, Closets and Stowage Bins, etc. LOPA also includes non-physical objects such as walking areas (in cross aisles and passageways), clearance areas for doors, areas where flight attendants stand, and many other areas. There is also space defined where an object may occupy if the airplane were to drop or stop suddenly. Examples of this space is a head strike zone where the passenger's head would travel if projected forward, or seat clearance, where the seat may move slightly forward. Sometimes spatial areas are required if in front of a passenger seat, for example, where other times it is not required, such as in front of a panel, or partition. Deciding and designing the placement of all these objects, commodities and spatial areas and zones, is a detailed and very time consuming task.

While placing commodities in the LOPA, there are hundreds, perhaps even thousands, of permutation where commodities can be placed and their rules activated by the placement. The problem is the ability to define every single possible configuration of commodity placement in the airplane. The commodity spatial area around it changes depending on what other objects are around it. There is no way to completely define each and every alternative solution. We need a generic solution to handle all possible permutations while placing commodities in the LOPA. Included are all the rules which need to be defined to aid in this solution.

Many problems may be encountered while designing the LOPA. For example, being unable to define all possible solutions upon placing a commodity. There is also the problem of being unable to define the difference between 'hard' and 'soft' collisions given today's geometry standards. In addition, the introduction of a new commodity would require the definition of all its alternative placements. It is also difficult to define when some rules are enforced and others are not for placement, while much time can be used to define placement permutations.

Every permutation is defined separately in software tools. However, there are missed placement solutions, and inaccurate LOPA arrangements. One may not be able to catch all physical geometry collisions (e.g. commodity itself), nor be able to recognize non-physical geometry collisions (e.g. door opening).

SUMMARY OF THE INVENTION

The foregoing needs are met, to a great extent, by the present invention, wherein in one aspect an apparatus provides the best solution for placement of commodities, reducing the time, resources and cost needed to place all commodities by eliminating the need of extensive permutation definition, and without a need to modify instructions when new commodities are added.

An embodiment of the present invention includes a method for resolving collisions for placement of objects in 3D models, the method comprising attributing a first state to each object having a hard spatial volume and a second state to each object having a soft spatial volume, predefining a first set of rules to determine whether multiple objects may occupy the same spatial volume based on the combination of the object states, the first set of rules covering all permutations of said first state and said second state, placing a first object in the 3D model, placing a second object in the 3D model, determining whether the first object has a collision with the second object in the 3D model, and resolving the collision based on said first predefined set of rules.

It is also preferable that there is predefining a second set of rules that override the first set of rules, and wherein the resolving the collision is based on the second set of rules. The first set of rules can include the relationship between hard and soft geometries. There can also be a determining whether to accept or reject the position of the objects based on the collision resolution. There can also be moving the second object to another location when determining to reject the position of the objects. There can also be no change in position of the first and second objects when the positions are determined to be accepted. The technique of the present invention can also be executable on a computer readable medium.

Another embodiment of the present invention includes a system for resolving collisions for placement of objects in two or three dimensional models, the system including a processor attributing a first state to each object having a hard spatial volume and a second state to each object having a soft spatial volume, predefining a first set of rules to determine whether multiple objects may occupy the same spatial volume based on the combination of the object states, the first set of rules covering all permutations of the first state and the second state, placing a first object in the three dimensional model, placing a second object in the three dimensional model, determining whether the first object has a collision with the second object in the two dimensional or three dimensional model, and resolving the collision based on the first predefined set of rules, a memory storing the first set of rules for determination of the collision between the first and second objects, and a display showing the resolving of the collision between the first and second objects based on the first predefined set of rules. It is also preferable that the processor is predefining a second set of rules that override the first set of rules, and wherein the resolving the collision is based on the second set of rules.

Another embodiment of the present invention includes a system for resolving collisions for placement of objects in three dimensional models, where the system includes a means for attributing a first state to each object having a hard spatial volume and a second state to each object having a soft spatial volume, a means for predefining a first set of rules to determine whether multiple objects may occupy the same spatial volume based on the combination of the object states, the first set of rules covering all permutations of the first state and the second state, a means for placing a first object in the three dimensional model, a means for placing a second object in the three dimensional model, a means for determining whether the first object has a collision with the second object in the three dimensional model, and a means for resolving the collision based on the first predefined set of rules. It is also preferable that a second set of rules that override the first set of rules be predefined and applied in the collision resolution.

Additionally, the technique of the present invention can be applied to a two dimensional space in addition to the three dimensional space.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIGS. 3A, 3B, 3C, 3D, 3E, 3F and 3G are illustrations of different portions of vehicles as used in an embodiment of the present invention.

FIG. 4 is a flow chart of the programmatic logic used in an embodiment of the present invention.

FIG. 7 illustrates another example of commodities and rules with regard to the commodities.

FIG. 8 illustrates an example of commodities being placed together in a space.

FIG. 9 illustrates the movement of the commodity from FIG. 8 being moved when the placement is rejected.

DETAILED DESCRIPTION

An embodiment in accordance with the present invention provides a Knowledge Based Interior Development tool, or an eConfig tool, that enhances and automates the process for developing interior configurations. The tool enables configurators to easily and efficiently generate the large number of interior configurations required in the product development, sales, and customer introductions environment. Additionally, the data generated by the application provides the foundation for sharing configuration data among downstream users. A full-time link to a database is established to retrieve the required input parameters and then the configuration geometry and arrangement is generated in the Computer Aided Design system by the Knowledge Based Interior Development tool. Finally, the selected rule-set is saved back to the database for future reference. Specific data, such as seat and commodity locations, may also be stored in a database for future use by downstream users.

The Knowledge Based Interior Development tool enables the users to easily and efficiently access and share geometry and parameter data for the development of interior designs while consistently checking and assuring compliance with certification regulations. The Knowledge Based Interior Development tool establishes a number of new approaches to interior design. The system uses a rule based approach, which allows users to select configuration requirements, or rule sets, from a series of dialog boxes. The system saves the rule set, creates the geometry of the interior, and lays out the interior arrangement, at run time, when the rule sets are chosen and/or created. The system captures knowledge, rules, and parameters in a database, and can be retrieved on demand.

The interior is designed using a zonal approach, where every object in the system has a zone that defines the boundaries within which it can be placed. In a preferred embodiment, there are seven levels of zones from the Layout of Passenger Accommodation (LOPA) level, which represents the entire interior of the vehicle, to the monument level, which is a separate level for each individual monument, which can include galleys, lavatories and closets. Zones are not defined by their location, but by relation to the neighboring zones and features of the vehicle. Each zone shares boundary information with the neighboring zones and becomes the component of the parent level zone. The Knowledge Based Interior Development tool uses a database approach, whereby a full time link is established to a database holding the required parameters. The system can access the database to output the configuration rule set, the static geometry, and location data which can be accessed and utilized by downstream systems.

Figure 1:
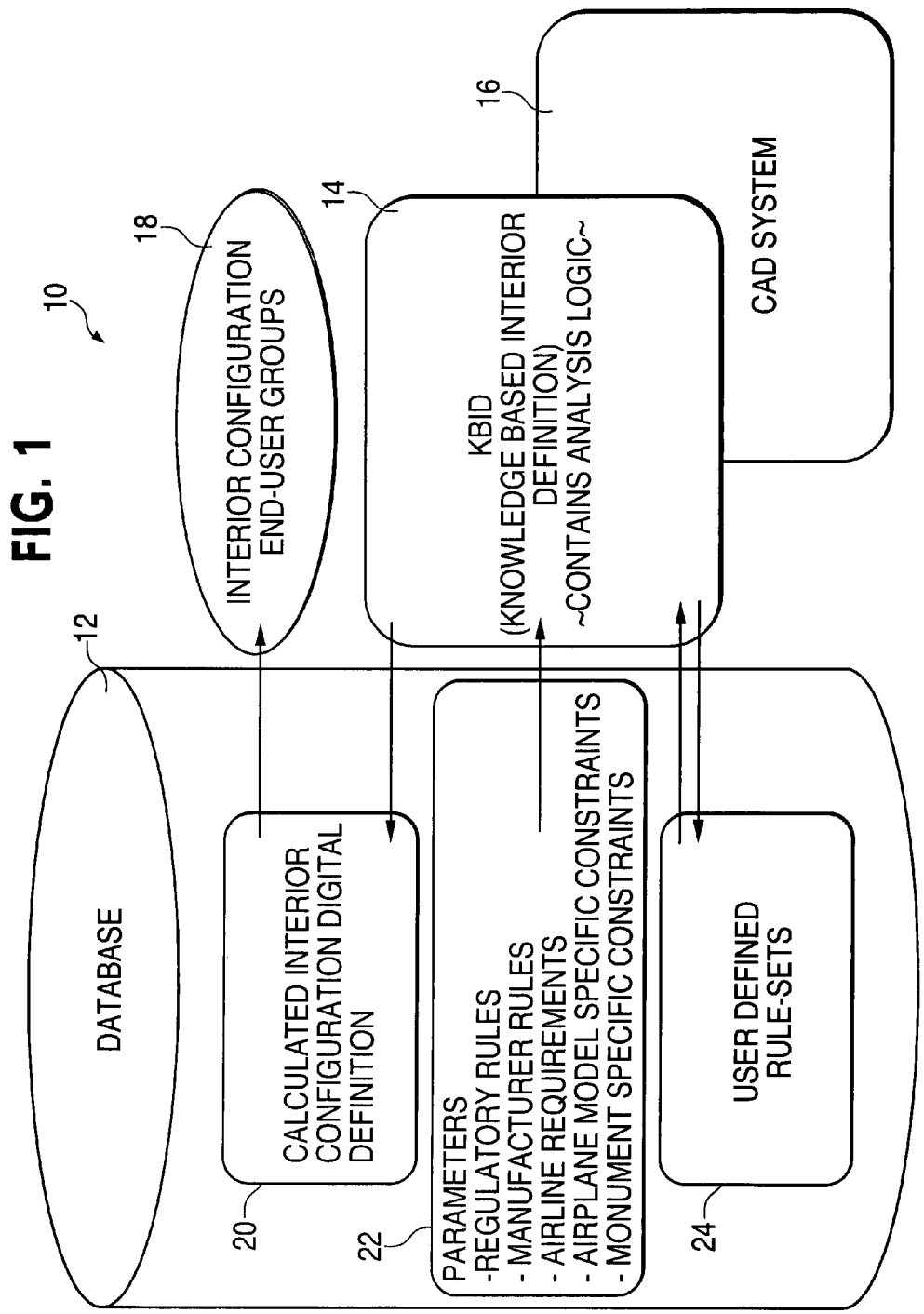
FIG. 1 is a diagram illustrating system architecture according to a preferred embodiment of the invention.

The invention will now be described with reference to the drawing figures, in which like reference numerals refer to like parts throughout. An embodiment of the present inventive system and method is illustrated in FIG. 1, which illustrates the overall architecture of a system 10. The system 10 contains a database 12, Knowledge Based Interior Definition analysis logic 14, a Computer Aided Design (CAD) system 16, and a User Interface 18. The database 12 is stored on a computer-readable storage media, such as a hard disk drive. The analysis logic 14, CAD system 16, and user interface 18 are also stored on storage media. In a preferred embodiment, the analysis logic 14, CAD system 16 and user interface 18 are all stored on the same storage medium as each other, but a different storage medium than the database 12.

The database 12 contains calculated interior configuration digital definitions 20, parameters 22, and user-defined rule-sets 24. The parameters 22 include fixed rules that are applicable to all vehicles, or all vehicles of a particular type. These include governmental rules, industry standards, manufacturer standards, customer standards, and/or constraints based on the specific model of vehicle, or based on any specific monument to be placed within that vehicle. The system contains links so that its parts can obtain information from each other. There is a link between the Calculated Interior Configuration Digital Definition 20 and the User Interface 18, so that the user can save the configuration in database format. In a preferred embodiment, the configuration is not saved as a CAD file, in CAD format. This format would store only the coordinate location of each object in the vehicle. Instead, the configuration is saved in the database 12, and contains the rules, parameters, and other settings that are used to create the layout. However, the parameter information in the database 12 can be exported in its native format or in a format usable by other CAD systems, for use in downstream applications such as later redesign, retrofitting, or repair.

There is a link between the analysis logic 14 and the Calculated Interior Configuration Digital Definition 20. The system uses this link so that the analysis logic can save changes to layout plans in the database format discussed above. There is also a link between the parameters 22 and the analysis logic 14. The analysis logic 14 has access to the parameters 22 stored in the database 12, so that the analysis logic 14 can apply the constraints contained in the parameters. The analysis logic 14 applies the parameters 22 to create a layout of an interior, as will be described below. The analysis logic 14 and the user-defined rule-sets 24 have links with each other in both directions. This allows the analysis logic to take rule sets created by the user and save them in the database 12 so that they can be fully accessed during a later process, and also allows the analysis logic to extract user-defined rule sets and apply them to a current layout process. The analysis logic 14 is also layered on top of the CAD system 16. This allows the analysis logic 14 to create a CAD drawing of the layout, so that it can be viewed by the user in visual form, and viewed later by other users using different CAD systems. The information on database 12 can be in any one of a database format and extensible markup language (XML) format. Other formats for storage of the information on database 12 can be used.

Figure 2:
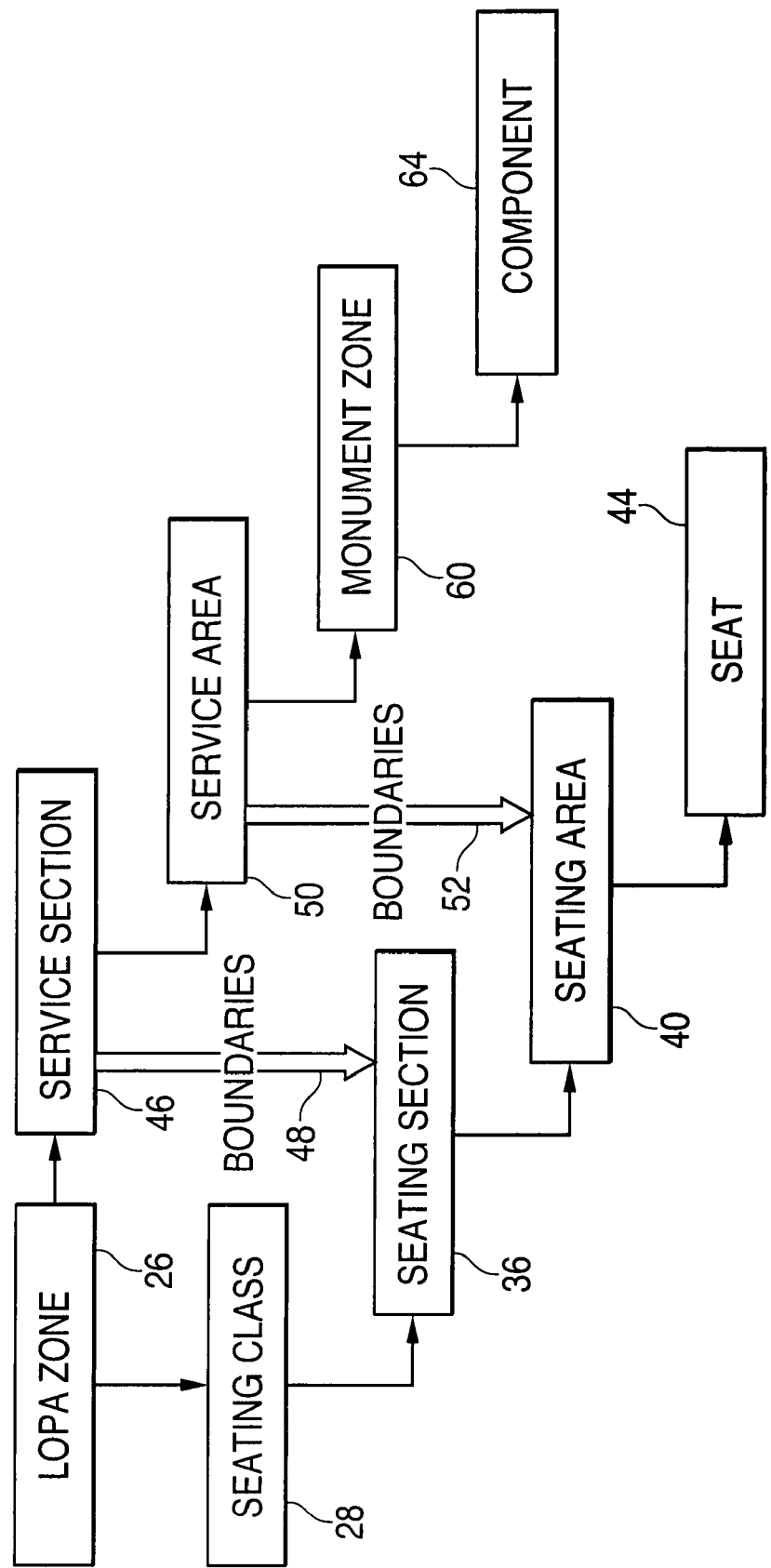
FIG. 2 is a chart illustrating levels of zones according to a preferred embodiment of the present invention.
Figure 3B:
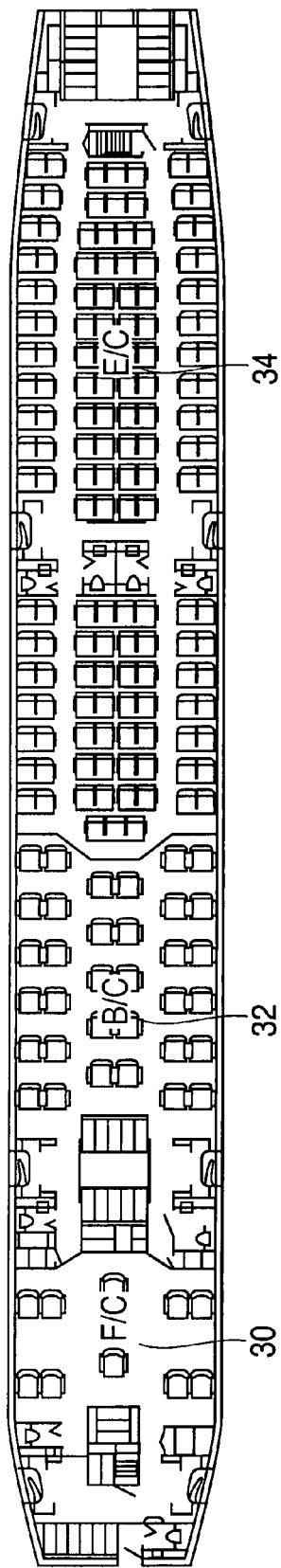

Turning now to FIG. 2, a hierarchical diagram of zones is shown. The system according to a preferred embodiment of the present invention divides the vehicle into a number of zones. The zones are arranged in a hierarchy wherein each zone represents a smaller portion of the vehicle, and there can be one or more smaller zone inside a larger zone. FIGS. 3A-3G show examples of each zone. FIGS. 3A-3G demonstrate the zones in the context of a passenger airplane, but it should be understood by one of ordinary skill in the art that these zones are applicable to any mass transit passenger vehicle. The first zone is the Layout of Passenger Accommodation (LOPA) zone 26, which is shown in FIG. 3A. The LOPA zone is the entire passenger section of the airplane, and is bounded by the forward and aft bulkheads. All of the smaller zones are components of the LOPA zone, as will be shown in the figures below.

The LOPA zone contains multiple zones that can be of two types. One type is the seating class zone 28. As shown in FIG. 3B, the LOPA zone can be divided into one or more seat class zones. Examples of seat class zones are First Class 30, Business Class 32, and Economy Class 34. It should be understood by one of ordinary skill in the art that other seat classes can be used, including premium, economy, and tourist classes. Additionally, it should be understood that some passenger vehicles may have only one seat class zone which can be commensurate in size with the LOPA zone. Having a passenger vehicle divided into seat class zones allows the configurator or other creators of rules to implement different rules in each seat class zone of the vehicle. Examples of rules that differ between seat class zones would be the width of the seats, the distance from the front to the back of the seat, the distance between the back of one seat to the front of another (e.g. the "legroom"), the amount by which the chairs are permitted to recline, and the width of aisles.

Figure 3C:
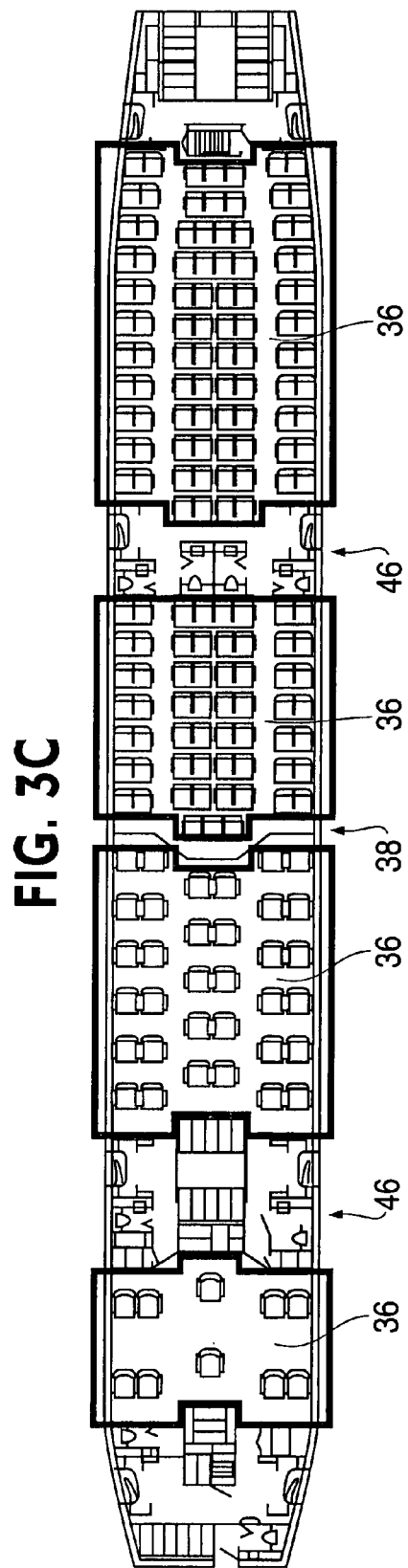

The next zone in the seating branch of the hierarchy is the seating section zone 36, which is depicted in FIG. 3C. The boundaries of these seating section zones are established at each door break 38 within the class zone. By dividing the class zone into seating section zones, configurators can have different rules for different segments of the plane based on the location of the doors 38. Customers or regulatory bodies may have different requirements for seating or other monuments, depending on the side of a given door on which they are located. Creating separate zones for each door-to-door (or door to end-of-plane) segment allows configurators to implement different rules for each segment.

Figure 3D:
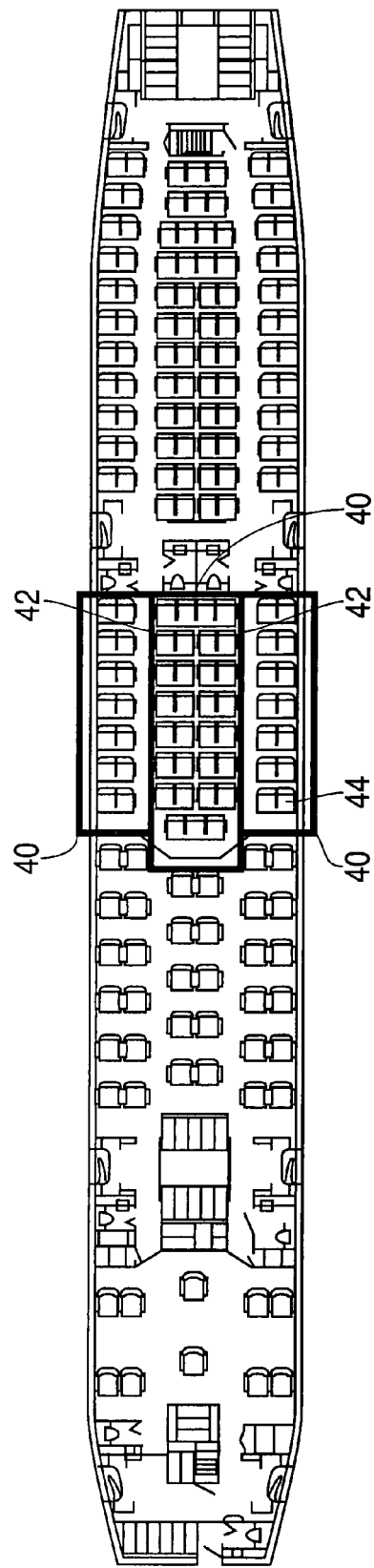

One level lower in the seating branch of the zone hierarchy is seating area zone 40, as illustrated in FIG. 3D. The seating area zones are bounded laterally at each horizontal aisle 42. Having each lateral row of seats, bounded by aisles or the sides of the plane, allows separate rules to be created for each seating area zone. Once a width for a lateral zone has been established, the configurator can experiment with seat configurations, within the rules, to achieve maximum space utilization. The configuration of the seats needed to achieve maximum space utilization may be different on one side or the other or different rules may apply to center rows than apply to side rows. Adding the flexibility to create different configurations based on lateral zone gives configurators the ability to better utilize space. Additionally, the configurator has the option of configuring each individual seat 44.

Figure 3E:
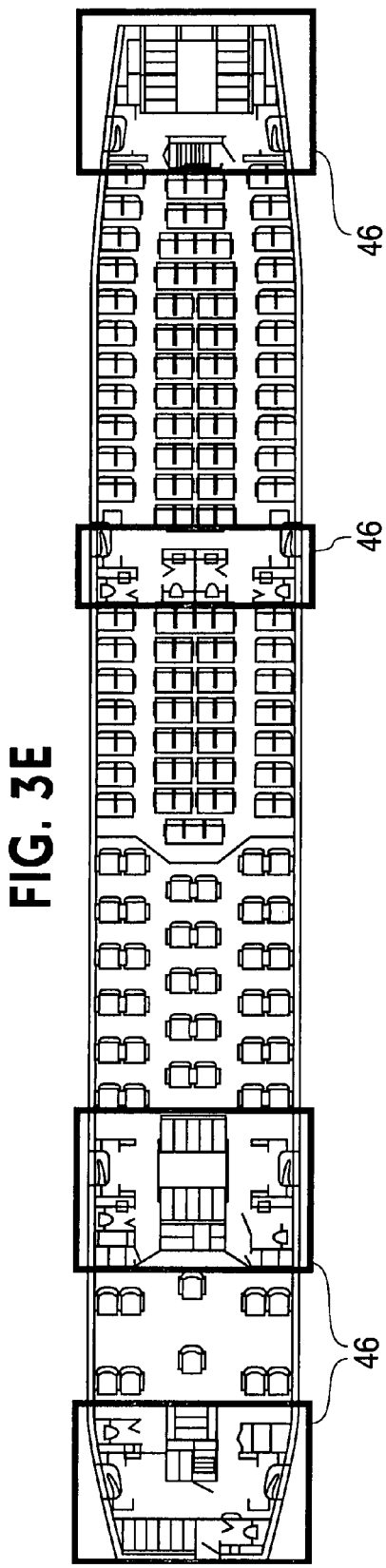

In addition to seating class zones 28, the LOPA zone can also contain one or more service section zones 46, as shown in FIG. 3E. Service section zones are bounded on one or both sides by seating section zones, as depicted by the boundaries 48. Service section zones are those areas of the vehicle where service monuments are stored. Service monuments include galleys (or kitchens), lavatories, and closets. Having a zone for the commodity section as a whole, in addition to smaller zones therein (described below) allows the configurator to adjust the size of the zone as a whole, in relation to the seating sections, without regard to which particular type of commodity is contained within the zone. Also, regulatory bodies and/ or customers may have rules regarding commodity zones generally, which can more easily be applied with this more generic zone.

Figure 3F:
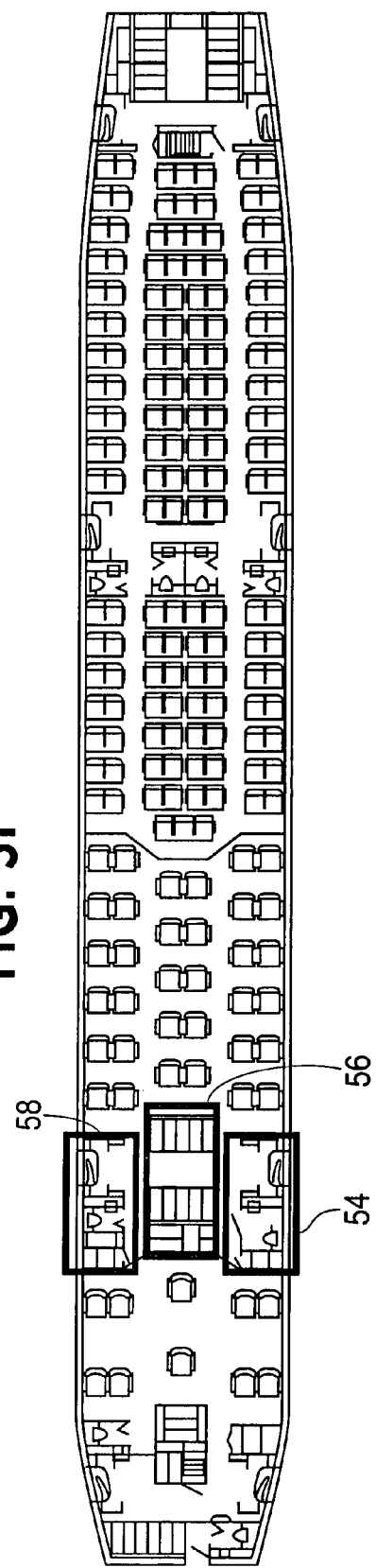

The next zone in the service branch of the zone hierarchy is the service area zone 50, as depicted in FIG. 3F. Much like seating area zones 40, service area zones 50 are separated by aisles. As depicted with the boundaries 52, service area zones 50 are bounded by seating area zones 40. As shown in FIG. 3F, the preferred embodiment uses three service area zones 50 for each service section zone 46: a left service area 54, a center service area 56, and a right service area 58.

Figure 3G:
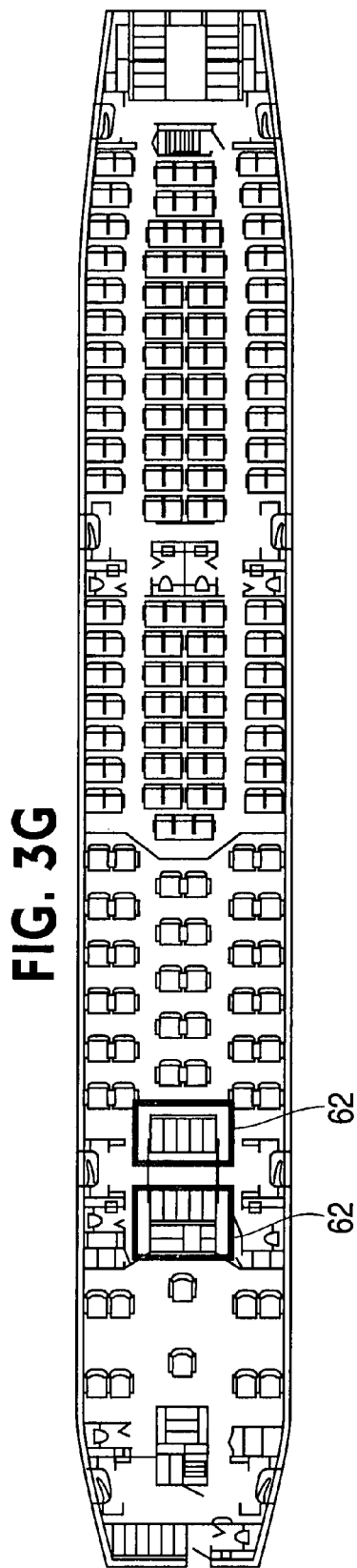

One level lower in the service branch of the zone hierarchy is the monument zone 60, as illustrated in FIG. 3G. The monument zone 60 is defined by the boundaries of each individual monument, such as a lavatory, a galley, or a closet 62. Regulatory agencies or customers could impose rules that a lavatory or galley must have a minimum area, or length or width, or that a galley must, for safety reasons, be surrounded by a certain amount of unused space. These details can be handled with rules that affect the individual monument zones. Additionally, a configurator can add or configure individual components 64 within a particular monument zone.

Because the system uses the zonal approach, a configurator is able to impose rules that affect the entire vehicle, or different portions of the vehicle based on the zone of the portion the configurator would like to change. Some rules have wide-ranging applicability, applying to the entire LOPA zone, including regulations regarding the width of cross-aisles or the number of lavatories. Other decisions will be based on the class of service, including the dimensions of the seats, and the distance separating them. Still other decisions may be based on the cabin zone within a class, including exit-row requirements. Some decisions can apply on a lateral level, including the number of seats in a row. Certain decisions, like the distance between a commodity and a seat, will be governed at the commodity section level. Finally, other decisions may be based on the individual component itself, such as the layout of the inside of a lavatory. The ability to apply these rules at these different levels further automates the design process.

Turning now to FIG. 4, the iteration flow logic of a preferred embodiment of the present invention is shown. The configurator, when interacting with the user interface of the system, is given a number of options to change the layout of the vehicle, by changing rules for different zones, or for individual seats or rows of seats. In a preferred embodiment, there are three major categories of change that can be made to a layout by a configurator.

One change a configurator can make to the layout of a vehicle is to change a seating section 66. The configurator can change a seating section by changing any of the properties of seats in that section. For example, the configurator can change the width of the seats in a given section, the pitch of the seats in a given section, or the recline distance of all seats in a given section. It should be noted that these global changes can be made in the seat class model zone, the cabin segment zone, or the lateral zone, allowing the configurator to change the seat dimensions for larger or smaller groups of seats. Additionally, the configurator can change a single row of seats, or a single seat. For instance, in a preferred embodiment, the configurator can ask the system how an extra row of seats can be added to the configuration. The system may inform the user that, if the user reduces the reclining distance of one row by a certain number of inches, an additional row of seats can be added. The configurator's decision to make that individual change triggers the "Change Seating Section" logic 66.

Once the configurator has decided to change a seating section, the software executes the portion of the code that arranges the seating 68. This code is able to rearrange the seating area to take the change into account. The code in this section implements the change specified by the user, and then updates the remainder of the seating section to take that change into account. Because all of the components are interrelated through zones and awareness of boundaries, the update is completed automatically. Following the example above, if the configurator reduces the recline distance of the seats in the last row by one inch, enough space may be freed up behind that row to insert another row of seats. The system knows this because the code is programmed to insert rows of seats behind other rows of seats if another monument (or the aft bulkhead) is not in the way. Thus, by changing the attributes of one row of seats, another row of seats is added automatically.

After the seating has been arranged to reflect the configurator's change, control is passed to the section of code responsible for the function of Updating the Service Section Laterally 70. Here, the software checks if a lavatory or a galley (i.e. a "service area") may be able to be expanded as a result of an update initiated by the user. If a lavatory or galley is preexisting, and no seats can be added, the system may expand the existing service area rather than leave the space adjacent to it unused. After these updates are made, the LOPA is regenerated, with new coordinate data being passed calculated and passed to the CAD system, and the LOPA is redrawn 72.

A configurator can also decide to make a change to a passage 74. A passage is an empty space where people or equipment can travel, including a passageway or a cross-aisle. A cross-aisle is an aisle of lateral orientation, and usually exists near the doors of the vehicle. In the case of passenger airplanes regulated by the United States Federal Aviation Administration, every pair of doors must be accompanied by a cross-aisle of at least 20 inches in width. Manufacturers or customers may have requirements of wider cross-aisles. Also, there may be a requirement that a cross-aisle be wider if it is bordered on either side by a galley or a lavatory. Subject to these constraints, however, a configurator has some leeway in locating passages within the vehicle.

If a passage is changed, the software determines whether the passage has been moved or resized 76. If the passage has not been moved or resized, but has changed in some other way, the software passes control to the seating arrangement code 68. As described above, this code rearranges the seating based on the change made to the configuration—in this case the change to the passage. When the seating has been rearranged, the code passes control to the code used to update service section laterally 70. As described above, this updates a service section based on any seating change, and also based on the passage change. When this update is completed, control is passed to the LOPA reconfiguration code 72, which recalculates all of the coordinate data and redraws the LOPA. The code then returns.

If the passage has been moved or resized, control is passed to the code for updating a service section longitudinally 78. This code is responsible for checking if a service section—a galley or a lavatory—needs to be updated as a result of the moving or resizing of a passage. Because the data representing the service section has links to the data representing the passage, and knows where its boundaries are, the code is able to determine if a service section is affected by a change in a passage. For example, if a configurator decides to expand a cross-aisle beyond the required distance, a galley bordering that cross-aisle may need to be moved forward or backward, depending on the direction of the change in the cross-aisle.

After the service sections bordering or otherwise affected by the moved or resized passage have been updated 78, control is passed to the code for arranging seating 68. As described above, this code rearranges the seating based on the change made to the configuration—in this case the change to the passage. When the seating has been rearranged, the code passes control to the code used to update service section laterally 70. As described above, this updates a service section based on any seating change, and also based on the passage change. When this update is completed, control is passed to the LOPA reconfiguration code 72, which recalculates all of the coordinate data and redraws the LOPA. The code then returns.

In addition to changing seating sections or passages, a configurator can also be presented with the option of changing a service section itself 80. As noted above, a service section is usually either a galley or a lavatory, though a closet or any other monument can also be considered a service section. When the configurator has changed a service section, the code checks if the service station has been moved or resized 82. One way to change a service station without moving or resizing it is to re-arrange the items inside it. For example, the orientation of a commode or a sink within a lavatory can be changed without moving or resizing the lavatory itself. If the service section has not been moved or resized, the system passes control to the code responsible for updating the service section laterally 70. When this update is completed, control is passed to the LOPA reconfiguration code 72, which recalculates all of the coordinate data and redraws the LOPA. The code then returns.

If the service section has been moved or resized, the system passes control to the section of code responsible for updating a passage in response to the change in the service section 84. For example, if a galley is added to the LOPA adjacent to a cross aisle, the cross-aisle must be extended to comply with safety regulations or customer rules requiring wider cross-aisles if they are bordered by a galley. This code updates the data for the passage that needs to be changed as a result of the change to, or addition or deletion of, a service section.

After updating the passage, the system asks if the update to the passage was a move or a resize, or whether it was some other type of update 76. As described above, if the passage has not been moved or resized, the seating may need to be arranged 68, which may result in a need to update a service section laterally 70. When this update is completed, control is passed to the LOPA reconfiguration code 72, which recalculates all of the coordinate data and redraws the LOPA. The code then returns. If the passage has been moved or resized, this triggers a longitudinal update to a service section 78, which may be another service section affected by the original change to a service station. After this has completed, control is passed to the code for arranging seating 68, which passes control to the code for updating a service section laterally 70. When this update is completed, control is passed to the LOPA reconfiguration code 72, which recalculates all of the coordinate data and redraws the LOPA. The code then returns.

Because of the automated nature of the system, updates can be concluded in a much shorter amount of time than was previously possible. This allows for live configuration during a demonstration to a customer, which was impractical with longer configuration times.

The present invention includes a computer aided method that is designed to use specially designed intelligent 3D graphics to place airplane commodities in the airplane interior per regulatory agency/company requirements. The logic is defined such that geometry is given an attribute value of its state. 'Hard' and 'Soft' geometry states are applied using rules. These rules define the relationship between Hard and Soft geometry, even specific to the commodity itself. For example, two Hard geometries cannot collide, yet two soft geometries may. However, sometimes there are unique circumstances which override these basic rules per the commodity geometry. This logic can be applied to any kind of object. Once a commodity's geometry is given, its state and any exceptions are recorded, the software tool need not be altered to be able to place this commodity. This is a huge benefit in time and resources. All permutations of where a commodity may and how it can be placed are non-incidental. This logic removes the doubt if all solutions are found and programmed.

The present invention provides the placement of commodities with the best solution. In addition, there is a reduction of time, resources and cost needed to place all commodities by eliminating the need of extensive permutation definition. All permutations can be resolved using the technique of the present invention. The software-programmed code does not need to be modified when new commodities are added or revised.

The logic can be re-used for any computing application that uses 3D spatial placement. This method can be modified to be used in the 2D space as well. Also, the software code can be re-used, not dependent on the images provided.

The technique of the present invention works for example within a computing tool. Its purpose is to provide a new and accurate way to place objects, which will be used, in a 3D (three-dimensional) space. The structure of this design is described in the following description. Its purpose is to accurately define the configuration of objects in a spatial design, i.e., what can go where, given the geometry, which defines its spatial placement requirements.

All geometry is given a state attribute of either 'Hard' or 'Soft' geometry. 'Hard' geometry are objects, which are physical in nature. For example, in a hard geometry, one cannot walk through the hard geometry. 'Soft' geometry, on the other hand, is a defined space, which is a stay-out area for other objects. This is because the space will be used for physical object interaction, e.g., opening a door space, pulling out a cart space, reclining a seat back space. Base rules are defined which describe where geometry states can co-exist, for example:

(a) Hard to Hard geometry can not be in the same space;
(b) Hard to Soft geometry can not be in the same space; and
(c) Soft to Soft geometry can be in the same space.

One can define exception rules based on the particular type of geometry. For example, the cushion on a seat back may collide with the head moving forward from a sitting position from the seat behind it. The cushion is a 'Hard' geometry, and the headspace, or Head Strike is 'Soft' geometry. The cushion and the headspace do not follow the basic rule (b) between the hard and soft geometry above, and they can be in the same space.

Therefore, the "Cushion Geometry" can be in the same space with "Head Strike Geometry", even though it does not follow the basic rule between hard and soft geometries. Other exception rules include the fact that "Attendant Geometry" cannot be in the same space with "Attendant Geometry". "Access Aisle Geometry" cannot be in the same space with "Seat Storable Geometry". Further, "Setback Or Pitch Geometry" cannot be in the same space with "Monument Storable Geometry". In addition, "Setback Or Pitch Geometry" can be in the same space with "Wall Mounted Geometry". On the other hand, "Cart Pull Out Geometry" cannot be in the same space with "Setback Or Pitch Geometry". "Cart Pull Out Geometry" cannot be in the same space with "Seat Storable Geometry".

All geometry needs to be created with the appropriate attributes. The present invention is not limited to the geometries that are listed in the following examples.

Figure 5:
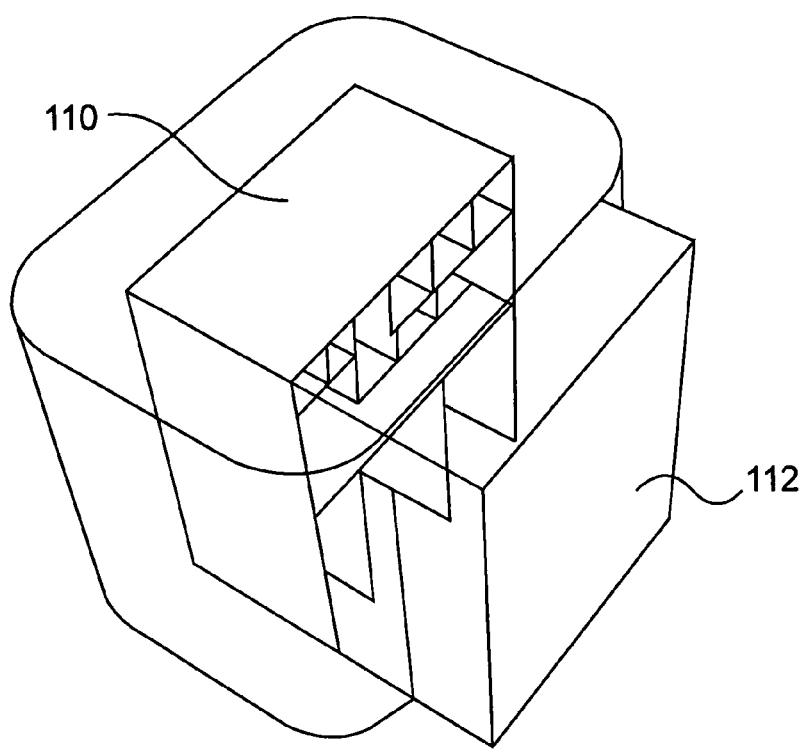
FIG. 5 illustrates an example of commodities and rules with regard to the commodities.
Figure 6:
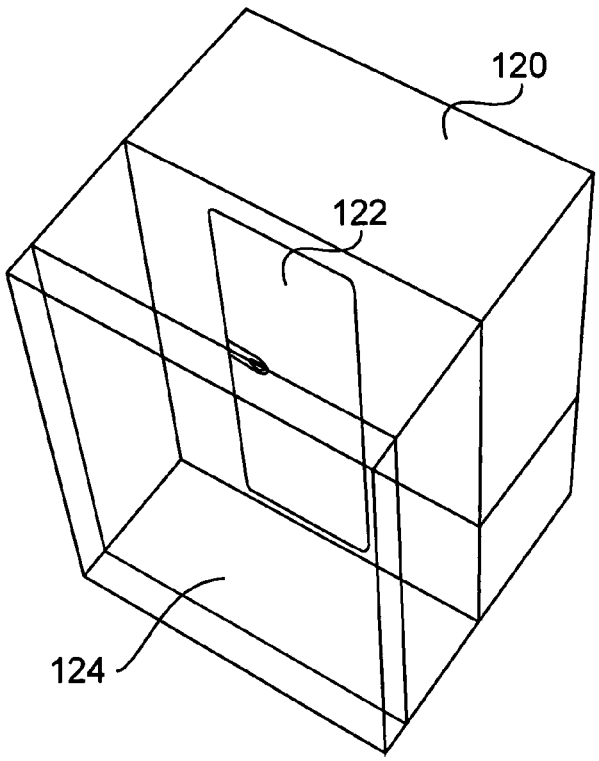
FIG. 6 illustrates another example of commodities and rules with regard to the commodities.

Referring to FIG. 5, the aft facing galley includes the collision attributes of the envelope geometry 110, which has a base rule attribute of a hard geometry. Also illustrated is the workspace aisle geometry 112 with a base rule attribute of a soft geometry. Additionally, the exception rule attribute for the workspace aisle geometry 112 is the monument storable geometry. Therefore, the workspace aisle geometry 112 cannot be in the same space as the monument storable geometry.

Referring to FIG. 5, the forward facing portion of the lavatory is illustrated. The collision attributes on the geometry includes the envelope geometry 120, which has a base rule attribute of a hard geometry. The access aisle 122 geometry has a base rule attribute of an access aisle geometry. Furthermore, the exception rule for the access aisle 122 concerns another access aisle geometry. Therefore, the access aisle geometry 122 cannot be in a space with another access aisle geometry. Another illustrated geometry is the access aisle geometry 124, which has a base rule attribute of a soft geometry.

Referring to FIG. 7, the collision attributes on the geometry include the envelope geometry 130, the setback or pitch 132, and the opened leg rest 134. The envelope geometry 130 has a base rule attribute of a hard geometry, and an exception rule attribute of cushion geometry. The setback or pitch 132 has a base rule attribute of a soft geometry, while the exception rule attribute is the setback or pitch geometry. The opened leg rest 134 has a soft geometry and its exception rule is the seat storable geometry.

As each commodity is placed in the space, the program uses its attributes to define if there is a collision. Rules are applied for forward/aft placement or side-by-side placement. For the sake of example, only certain placement configurations and attributes are being used. The examples are designed to only show the forward/aft placement of Galley to Lavatory and Galley to Seat placements.

Figure 10:
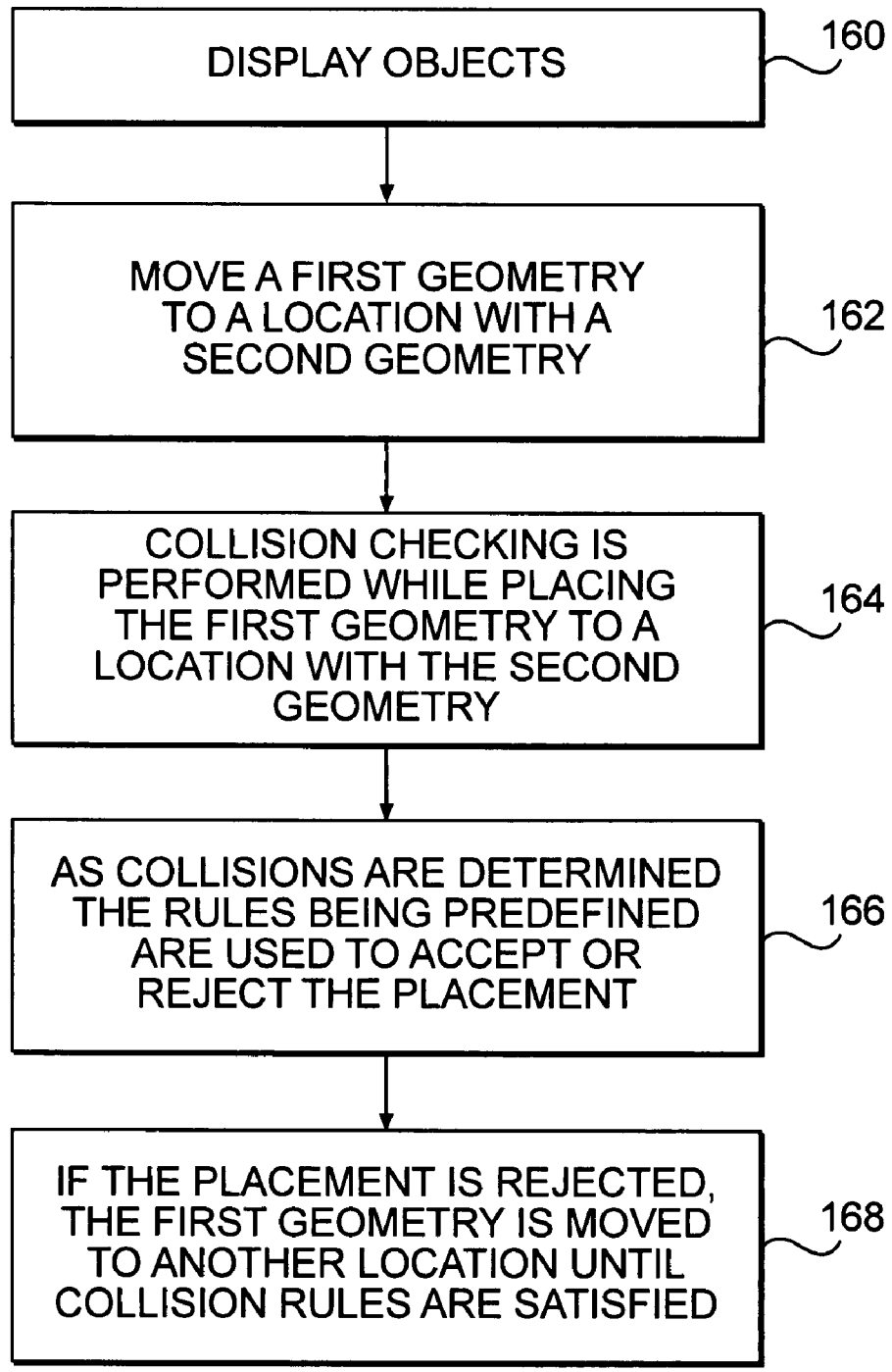
FIG. 10 is a flow diagram of the technique illustrated in FIGS. 8 and 9.

Referring to FIGS. 8 through 10, an example of the Galley to Lavatory Aft/Forward Placement is illustrated. The lavatory 140 and the aft side of a galley 150 are displayed (step 160). A first geometry is moved to the space of the second geometry (step 162) as seen in FIG. 8. Therefore, while placing a Lavatory 140 aft side of a Galley 150, collision checking is performed (step 164). As each collision is discovered, the rules, as shown below, are used to accept or reject the placement (step 166). If the placement is rejected, the commodity is moved to another location until either it cannot be placed in the defined location, or until the collision rules are satisfied as successful (step 168) as seen in FIG. 9.

The collision check is performed as follows. The collision is not allowed for Galley Envelope Geometry versus Lavatory Envelope Geometry because of the base rule of hard to hard geometry cannot be in the same space. The collision is not allowed for Galley Envelope Geometry versus Lavatory Access Aisle Geometry because of the base rule of hard to soft geometry cannot be in the same place. The collision is not allowed with Galley Envelope Geometry versus Lavatory Hard Surface Extra Aisle Geometry because of the base rule of a hard and soft geometry cannot be in the same place. With regard to the Galley Work Space Aisle Geometry versus Lavatory Envelope Geometry, the collision is not allowed because of the base rule of hard to hard geometry cannot be in the same place.

However, the collision is allowed for Galley Work Space Aisle Geometry versus Lavatory Access Aisle Geometry because of the base rule stating that the soft-to-soft geometry can be in the same space. Additionally, collision is allowed for the same reason with regard the Galley Work Space Aisle Geometry versus Lavatory Hard Surface Extra Aisle Geometry.

Figure 12:
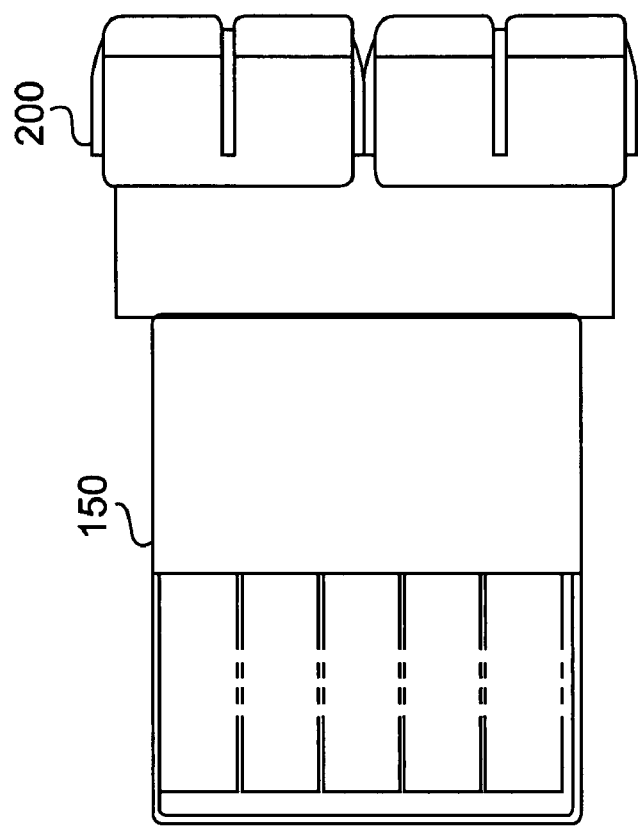
FIG. 12 illustrates the movement of the commodity from FIG. 11 being moved when the placement is rejected.
Figure 11:
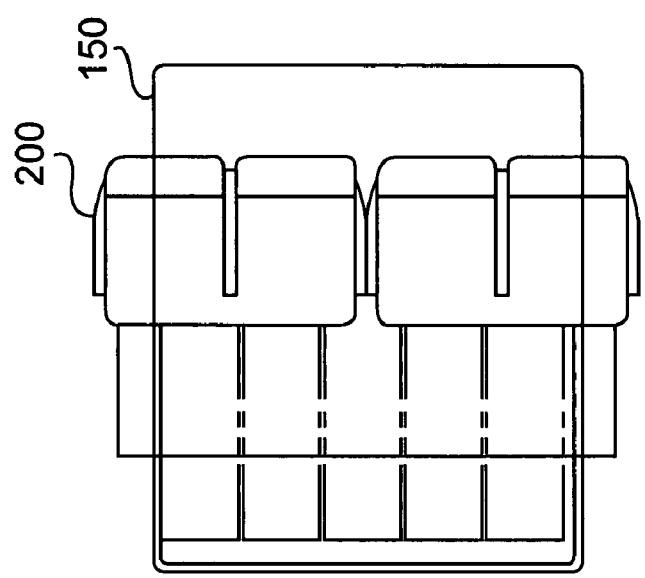
FIG. 11 illustrates another example of commodities being placed together in a space.

Referring to FIGS. 11 and 12, another example is shown with regard Galley to Seat Forward/Aft Placement. While placing a Seat aft side of a Galley, collision checking is performed. As each collision is discovered, the following rules are used to accept or reject the placement. If the placement is rejected, the commodity is moved to another location as seen in FIG. 11, until either it cannot be placed in the defined location, or until the collision rules are satisfied as successful.

The collision check is performed using the following rules. The collision is not allowed for Galley Envelope Geometry versus Seat Envelope Geometry because of the base rule of hard to hard geometry cannot be in the same place. The collision is also not allowed for Galley Envelope Geometry versus Seat Setback Or Pitch Geometry because of the base rule of hard to soft geometry cannot be in the same place. The Galley Envelope Geometry versus Seat Opened Leg Rest Geometry would apply the base rule of hard to soft geometry not being allowed to be in the same space, and therefore, collision is not allowed. The collision is also not allowed with regard to Galley Work Space Aisle Geometry versus Seat Envelope Geometry because both geometries are hard geometry.

On the other hand, with regard to Galley Work Space Aisle Geometry versus Seat Setback Or Pitch Geometry because of the geometries are soft, collision would be allowed, but an exception takes priority. Therefore, because of the exception rule of setback or pitch geometry cannot be in the same space with monument storable geometry, the exception takes priority over the base rule, and therefore, collision is not allowed.

With regard to the Galley Work Space Aisle Geometry versus Seat Opened Leg Rest Geometry, applying the base rule of soft-to-soft geometry, collision is allowed. However, in the example, the setback happens to be longer than the open Leg Rest Geometry, thereby it does not affect the positioning.

While placing a Lavatory, there are options of geometries, which can be used, dependent upon where the Lavatory is placed in relation to other objects in the airplane. From the rules, a Lavatory collection of geometries may include the Lavatory itself, plus an Access Aisle, Hard Surface Extra Aisle, or Seat deflection.

Figure 13:
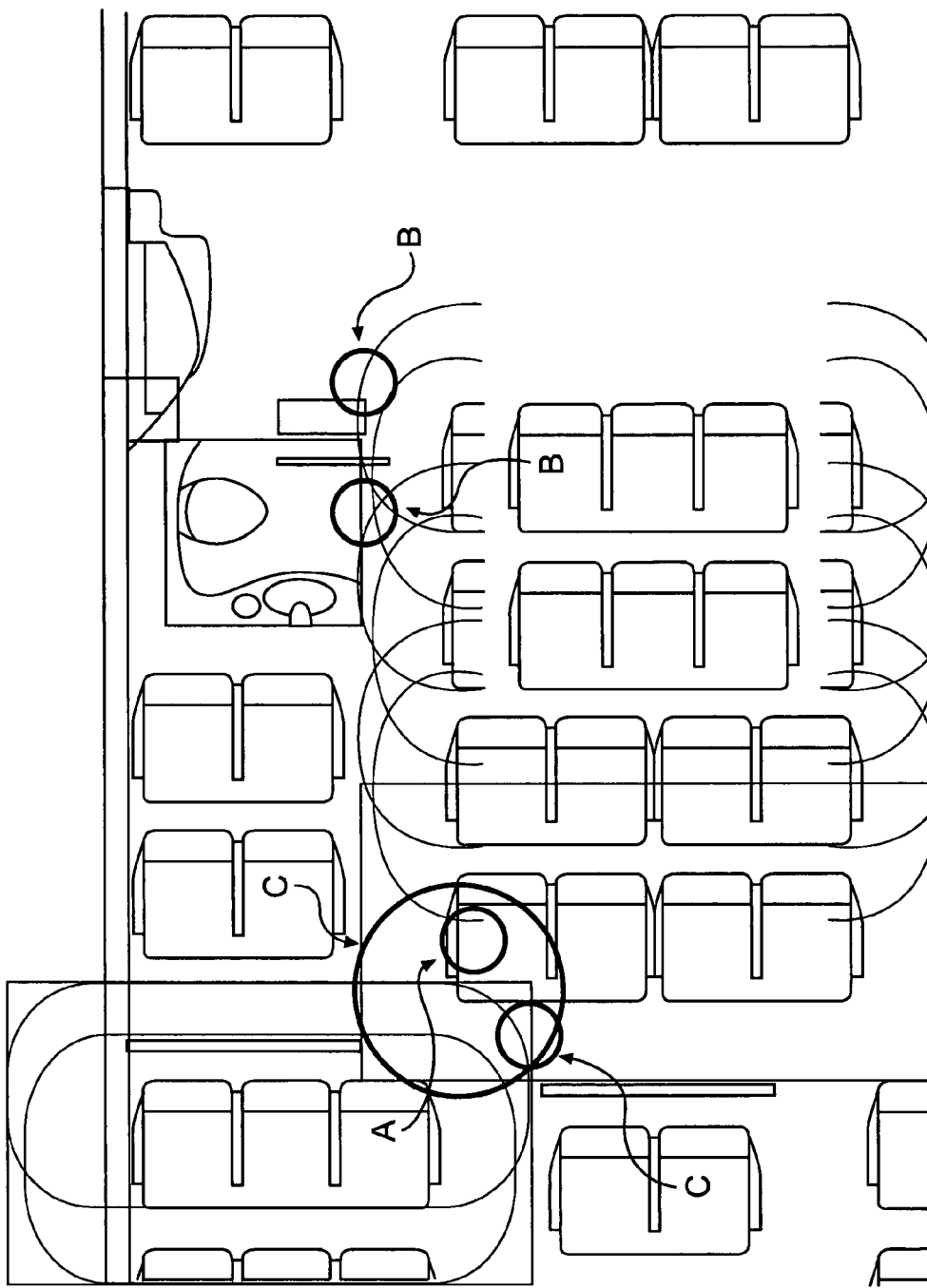
FIG. 13 illustrates the placement of different commodities in a space.

Referring to FIG. 13, as seen in reference "a", since the Lavatory is placed next to another monument (a hard surface geometry) and the door is opened to this geometry, an access aisle is required, plus the hard surface extra aisle.

Another example shows a side-to-side placement in FIG. 13. The side-by-side placement uses the same logic to determine if collisions are allowed or not allowed between geometries. For the sake of example, the following rules apply to the geometries. Reference "a" shows a collision condition where the seats needed to be moved aft to resolve the collision. No collision between the prior class seat lateral aisle geometry and the seat block geometry. Reference "b" shows a collision condition where a smaller seat needed to be placed in order to resolve the collision. The collision between the side lavatory structure and the quad abreast seat lateral aisle collision geometry. A triple abreast seat block is selected as a substitute. Reference "c" shows a collision condition where a smaller class divider needed to be placed in order to resolve the collision.

A commodity would be placed with collision checking performed. When one was discovered, the application would reject the placement. The designer would then need to analyze the situation to see if it can be overridden. If so, programming would need to be updated to accept this collision. As the program developed, many collision rules would be defined, but not necessarily all of them. Discovering new conditions where collisions were accepted would continually happen, requiring program updates. All permutations of all configurations would never be reached.

The designing an aircraft interior, referred to as LOPA, Layout Passenger Accommodations, is shown only as an example and the present invention is not limited to such an example. The LOPA as mentioned above are physical commodities, such as Galleys, Lavatories, Closets and Stowage Bins, plus many others. Also included in the LOPA are non-physical objects such as walking areas (in cross aisles and passageways), clearance areas for doors, areas where flight attendants stand, and many other areas.

Placing LOPA commodities and spatial areas in the airplane (objects in 3D space) must follow pre-defined placement and relational rules. The basic assumptions are, first, the objects are defined as 3 Dimensional volumes. Secondly, the objects are related to each other in 3 Dimensional space. Thirdly, the objects are placed in a 3D confined space so that they do not collide with one another. Rules must be adhered to when placing objects (including FAA requirements). The object placement and rules can be applied to any direction in space. The best solution is selected based on provided location (3D space) and best use of space. The technique of the present invention can identify regions of overlap between objects that may be shared without conflict, thus increasing the utilization of space.

The present invention focuses on a generic method for collision detection, incorporating additional graphics around a given object. These additional graphics define the 'stayout' clearance areas or reference point/plane. They are created as part of the graphic, but each 'stay-out' clearance area or reference point/plane has its own 'intelligent' data attached to it. For example, given a Lavatory, there is space in front of the door that the door uses to open and close. The Lavatory also has space around it, to provide walking space on the lateral sides. These two spaces are defined separately and comply with their own regulatory data requirements. This data is used to identify collision/separation of objects and optimize space based on specific collision/separation rules. Logic is defined such that geometry is given an attribute value of its state. 'Hard' and 'Soft' geometry states are applied using rules. These rules define the relationship between Hard and Soft geometry, even specific to the commodity itself. For example two hard geometries cannot collide, yet two Soft geometries may. However, sometimes there are unique circumstances, which override these basic rules per the commodity geometry. This logic can be applied to any kind of object.

Figure 14:
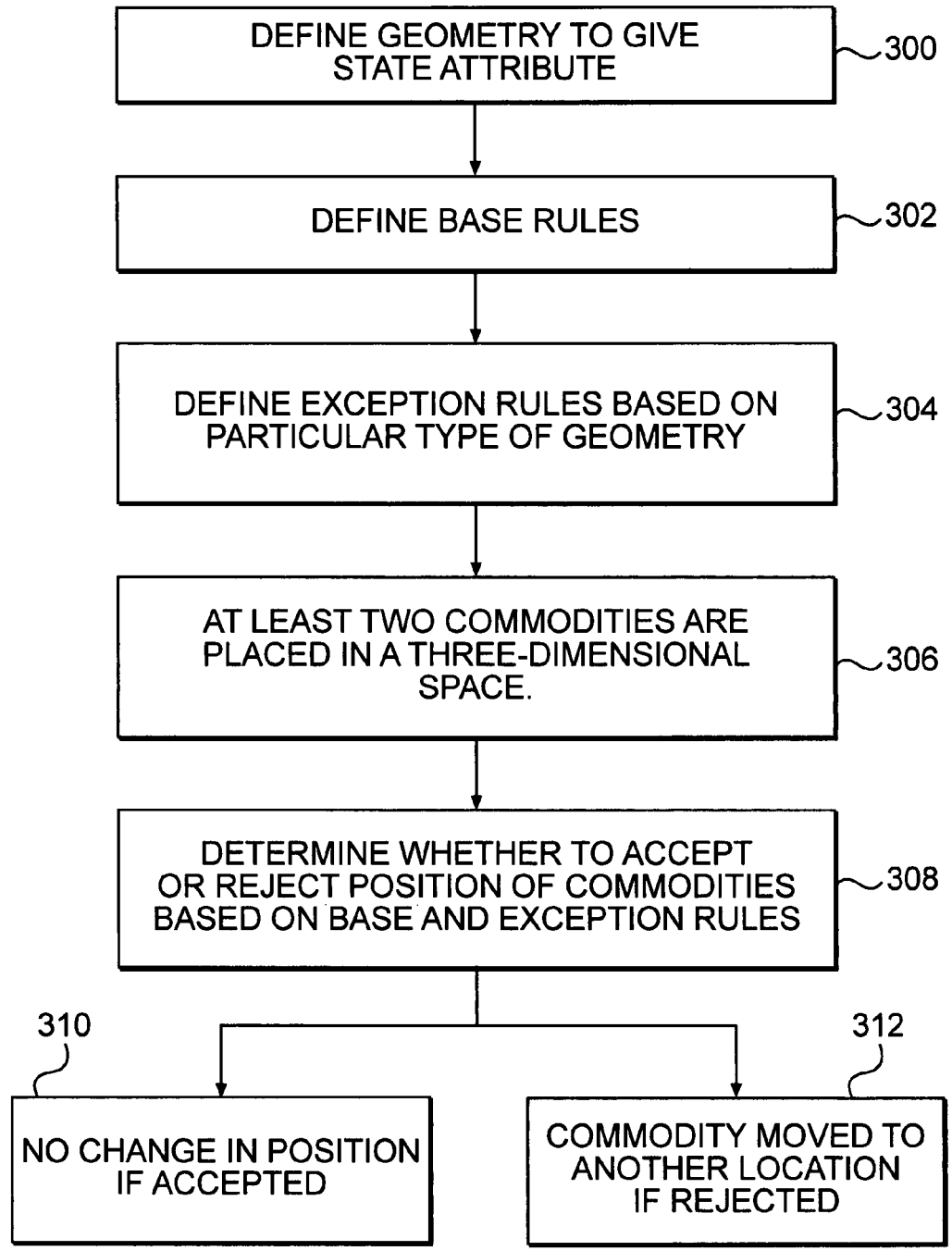
FIG. 14 is a flow diagram of another aspect of the present invention.

Referring to FIG. 14, for each object, the technique of the present invention defines geometry to give a state attribute, for example, 'Hard' or 'Soft' geometry (step 300). Then, one must define base rules, which describe where geometry states can co-exist (step 302).

Then after step 302, the technique of the present invention defines exception rules based on the particular type of geometry (step 304). For example, Cushion Geometry can be in the same space with Head Strike Geometry, Attendant Geometry can not be in the same space with Attendant Geometry, Access Aisle Geometry" cannot be in the same space with Seat Storable Geometry, etc.

At least two commodities are placed in a three dimensional space (step 306). Thereafter, the position of each of the commodities are accepted or rejected based on the predefined base and exception rules, where collisions are resolved based on the base rules and the exception rules (step 308).

If the position is accepted for each object, then there is no change in the position (step 310). However, if the placement is rejected, the commodity is moved to another location, until either it cannot be placed in the defined location, or until the collision rules are satisfied as successful (step 312).

The present invention can be realized as computer-executable instructions in computer-readable media. The computer-readable media includes all possible kinds of media in which computer-readable data is stored or included or can include any type of data that can be read by a computer or a processing unit. The computer-readable media include for example and not limited to storing media, such as magnetic storing media (e.g., ROMs, floppy disks, hard disk, and the like), optical reading media (e.g., CD-ROMs (compact disc-read-only memory), DVDs (digital versatile discs), re-writable versions of the optical discs, and the like), hybrid magnetic optical disks, organic disks, system memory (read-only memory, random access memory), non-volatile memory such as flash memory or any other volatile or non-volatile memory, other semiconductor media, electronic media, electromagnetic media, infrared, and other communication media such as carrier waves (e.g., transmission via the Internet or another computer). Communication media generally embodies computer-readable instructions, data structures, program modules or other data in a modulated signal such as the carrier waves or other transportable mechanism including any information delivery media. Computer-readable media such as communication media may include wireless media such as radio frequency, infrared microwaves, and wired media such as a wired network. Also, the computer-readable media can store and execute computer-readable codes that are distributed in computers connected via a network. The computer readable medium also includes cooperating or interconnected computer readable media that are in the processing system or are distributed among multiple processing systems that may be local or remote to the processing system. The present invention can include the computer-readable medium having stored thereon a data structure including a plurality of fields containing data representing the techniques of the present invention.

Figure 15:
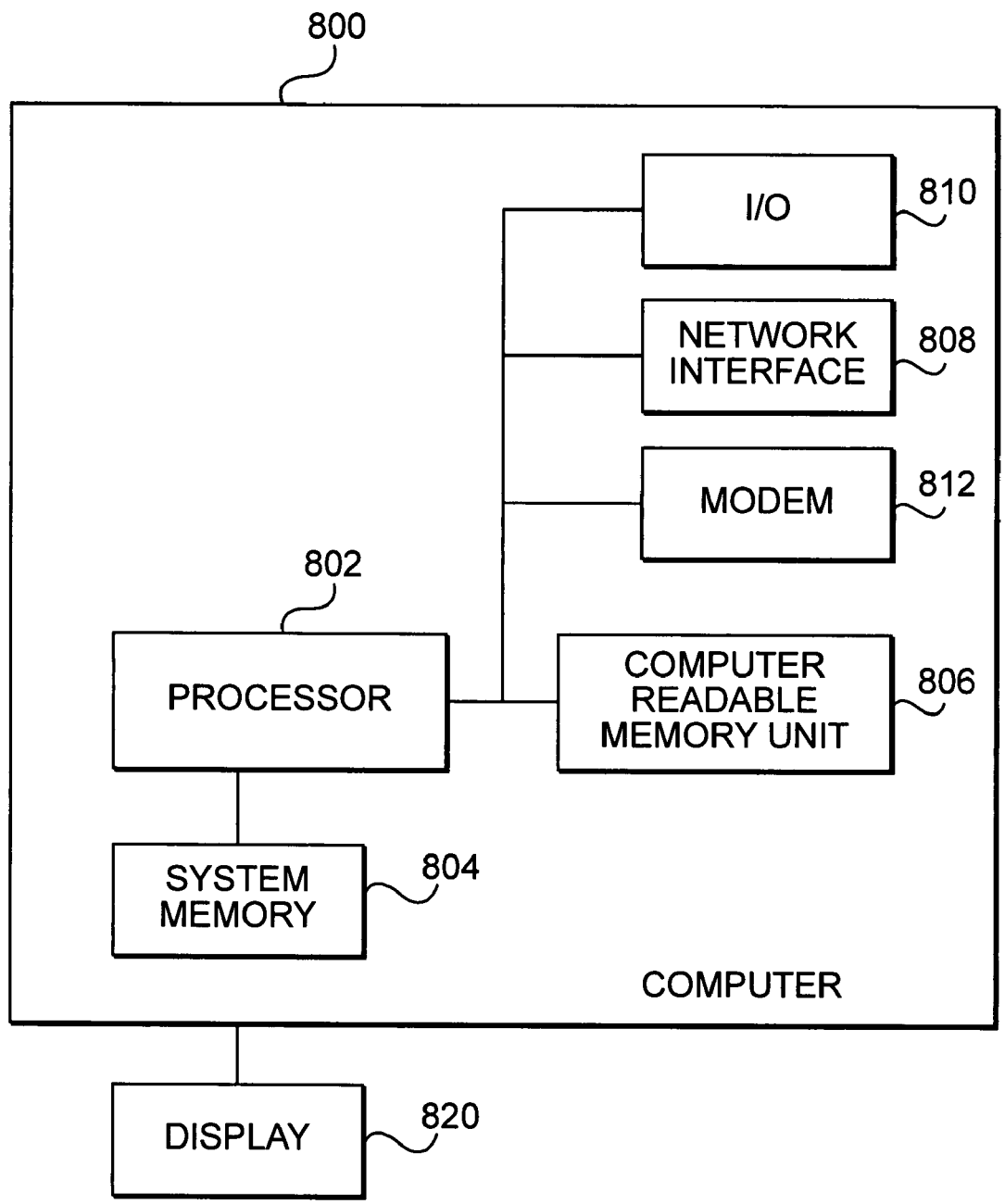
FIG. 15 is block diagram of an example computer system where the instructions of the present invention is executable.

An example of a computer, but not limited to this example of the computer 800, that can read computer readable media that includes computer-executable instructions of the present invention includes a processor that controls the computer as shown in FIG. 15. The processor 802 uses the system memory 804 and a computer readable memory device that includes certain computer readable recording media. A system bus connects the processor 802 to a network interface 808, modem 812 or other interface that accommodates a connection to another computer or network such as the Internet. The system bus may also include an input and output (I/O) interface 810 that accommodate connection to a variety of other devices. Furthermore, the computer 800 can output through, for example, the I/O 810, data for display on a display device 820.

The present invention is defining stay-out areas as separate entities that are associated with collision rules. Further, the present invention is using two-state attribute (hard, soft) to simplify base rules, allow rule coverage for all states, and identifying collision rules which allow the shared used of stay-out space, or avoids collisions to optimize object arrangement.

Although an example of the system is shown using a particular set of commodities, it will be appreciated that other commodities can be used as appropriate to the type of vehicle being configured. Also, although the system is useful to configure the interior of passenger aircraft it can also be used to configure the interior of other passenger vehicles, including commuter or long-distance railcars, subway cars, and busses, and other configurable spaces such as auditoriums or stadiums. Moreover, the present invention can be applied to not only three-dimensional space, but also to two-dimensional space.

The many features and advantages of the invention are apparent from the detailed specification, and thus, it is intended by the appended claims to cover all such features and advantages of the invention, which fall within the true spirit, and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for resolving collisions for placement of objects in a three dimensional model, the method comprising:
    attributing a first state to each object having a hard geometry and a second state to each object having a soft geometry;
    predefining a first set of rules based on regulatory requirements to determine whether multiple objects may occupy the same spatial volume based on the combination of the object states, the first set of rules covering all permutations of the first state and the second state and including the following rules:
        two hard geometries cannot occupy the same space;
        a hard geometry and a soft geometry cannot occupy the same space; and
        two soft geometries can occupy the same space;
    placing a first object in the three dimensional model;
    placing a second object in the three dimensional model;
    checking for collision of the first object with the second object in the three dimensional model; and
    resolving the collision based on the first predefined set of rules.

2. The method of claim 1, further comprising predefining a second set of rules that override said first set of rules, and wherein the resolving the collision is based on the second set of rules.

3. The method of claim 1, further comprising determining whether to accept or reject the position of the objects based on the collision resolution.

4. The method of claim 3, further comprising moving the second object to another location when determining to reject the position of the objects.

5. The method of claim 3, further comprising providing no change in position of the first and second objects when the positions are determined to be accepted.

6. The method of claim 2, further comprising determining whether to accept or reject the position of the objects based on the collision resolution.

7. The method of claim 6, further comprising moving the second object to another location when determining to reject the position of the objects.

8. The method of claim 6, further comprising providing no change in position of the first and second objects when the positions are determined to be accepted.

9. A computer program product comprising at least one computer readable storage medium having computer-readable program instructions stored therein that, when executed by a processor, perform the method of claim 1.

10. A system for resolving collisions for placement of objects in a two dimensional model or a three dimensional model, the system comprising:
    a processor performing the following steps:
        attributing a first state to each object having a hard geometry and a second state to each object having a soft geometry;
        predefining a first set of rules based on regulatory requirements to determine whether multiple objects may occupy the same spatial volume based on the combination of the object states, the first set of rules covering all permutations of the first state and the second state and including the following rules:
            two hard geometries cannot occupy the same space;
            a hard geometry and a soft geometry cannot occupy the same space; and
            two soft geometries can occupy the same space;
        placing a first object in the two dimensional or three dimensional model;
        placing a second object in the two dimensional or three dimensional model;
        checking for collision of the first object with the second object in the two dimensional or three dimensional model; and resolving the collision based on the first predefined set of rules;

a memory storing the first set of rules for determination of the collision between the first and second objects; and a display showing the resolving of the collision between the first and second objects based on the first predefined set of rules.

11. The system of claim 10, further comprising predefining a second set of rules that override the first set of rules, and wherein the resolving the collision is based on the second set of rules.

12. The system of claim 10, further comprising determining whether to accept or reject the position of the objects based on the collision resolution.

13. The system of claim 12, further comprising the processor moving the second object to another location when determining to reject the position of the objects and displaying on the display the movement.

14. The system of claim 12, further comprising providing no change in position of the first and second objects when the positions are determined to be accepted.

15. The system of claim 11, further comprising determining whether to accept or reject the position of the objects based on the collision resolution.

16. The system of claim 15, further comprising moving the second object to another location when determining to reject the position of the objects.

17. The system of claim 15, further comprising providing no change in position of the first and second objects when the positions are determined to be accepted.

18. A system for resolving collisions for placement of objects in a three dimensional model, the system comprising:

a means for attributing a first state to each object having a hard geometry and a second state to each object having a soft geometry;

a means for predefining a first set of rules based on regulatory requirements to determine whether multiple objects may occupy the same spatial volume based on the combination of the object states, the first set of rules covering all permutations of the first state and the second state and including the following rules:
two hard geometries cannot occupy the same space;
hard geometry and soft geometry cannot occupy the same space; and
two soft geometries can occupy the same space;

a means for placing a first object in the three dimensional model;

a means for placing a second object in the three dimensional model;

a means for checking for collision of the first object with the second object in the three dimensional model; and a means for resolving the collision based on said first predefined set of rules.

19. The system of claim 18, further comprising a means for predefining a second set of rules that override the first set of rules, and wherein the resolving the collision is based on the second set of rules.

20. The system of claim 18, further comprising determining whether to accept or reject the position of the objects based on the collision resolution.

21. The system of claim 20, further comprising moving the second object to another location when determining to reject the position of the objects.

22. The system of claim 20, further comprising providing no change in position of the first and second objects when the positions are determined to be accepted.

23. The system of claim 19, further comprising determining whether to accept or reject the position of the objects based on the collision resolution.

24. The system of claim 23, further comprising moving the second object to another location when determining to reject the position of the objects.

25. The system of claim 23, further comprising providing no change in position of the first and second objects when the positions are determined to be accepted.

26. A method for resolving collisions for placement of objects in a three dimensional model, the method comprising:

attributing a first state to each object having a hard geometry and a second state to each object having a soft geometry;

predefining a first set of rules based on at least one of regulatory requirements, manufacturer requirements, and customer requirements to determine whether multiple objects may occupy the same spatial volume based on the combination of the object states, the first set of rules covering all permutations of the first state and the second state and including at least one of the following rules:
two hard geometries cannot occupy the same space;
a hard geometry and a soft geometry cannot occupy the same space; and
two soft geometries can occupy the same space;

placing a first object in the three dimensional model;

placing a second object in the three dimensional model;

checking for collision of the first object with the second object in the three dimensional model; and resolving the collision based on the first predefined set of rules.

* * * * *